United States Patent [19]
Hayashi et al.

[11] Patent Number: 6,139,360
[45] Date of Patent: Oct. 31, 2000

[54] TRANSMITTING SYSTEM HAVING A CONNECTOR

[75] Inventors: Koji Hayashi, Tachikawa; Nobukazu Kato, Fussa, both of Japan

[73] Assignee: Japan Aviation Electronics Industry, Limited., Tokyo, Japan

[21] Appl. No.: 09/156,062

[22] Filed: Sep. 17, 1998

[30] Foreign Application Priority Data

Sep. 22, 1997 [JP] Japan .................................. 9-256925

[51] Int. Cl.[7] .................................................. H01R 11/00
[52] U.S. Cl. ............................................. 439/502; 439/65
[58] Field of Search .................................. 439/65, 67, 77, 439/493, 502, 505

[56] References Cited

U.S. PATENT DOCUMENTS

| | | |
|---|---|---|
| 3,492,538 | 1/1970 | Fergusson .................................. 439/67 |
| 3,731,254 | 5/1973 | Key .......................................... 439/502 |
| 4,936,792 | 6/1990 | Onoue et al. ............................ 439/493 |
| 5,195,897 | 3/1993 | Kent et al. ................................ 439/67 |

*Primary Examiner*—T. C. Patel
*Attorney, Agent, or Firm*—Laff, Whitesel & Saret, Ltd.; J. Warren Whitesel

[57] ABSTRACT

A transmitting system has first, second and third circuit boards. A peculiar connector is fixed on the second circuit board to engage to both a first connector and a second connector. The first circuit board is connected to the second circuit board with a first cable having the first connector. The second circuit board is connected to the third circuit board with a second cable having the second connector. The first circuit board and the third circuit board are connected to each other with the first cable, the peculiar connector, and the second cable.

5 Claims, 4 Drawing Sheets

TRANSMITTING SYSTEM HAVING A CONNECTOR

BACKGROUND OF THE INVENTION

This invention relates to a transmitting system, particularly, relates to a rapid transmitting system having three circuit boards which have circuits connected to one another through connectors and cables.

A conventional transmitting system has first, second and third circuit boards that have first, second and third circuits, respectively. The first circuit board equips a first connector, which is connected to the first circuit. The second circuit board equips second and third connectors that are connected to the second circuit. The third circuit board equips fourth connector, which is connected to the third circuit. The first connector and the second connector are connected by a first cable which has fifth and sixth connectors at both ends and which can be engaged with the first and the second connectors, respectively. Similarly, the third connector and the fourth connector are connected by a second cable which has seventh and eighth connectors at both ends and which can be engaged with the third and the fourth connectors, respectively.

In a case that a signal is transmitted from the first circuit to the third circuit, the signal passes through the first connector, the first cable, the second connector, the second circuit, the third connector, the second cable, and the fourth connector. The second circuit may have a receiver chip for receiving the signal from the first circuit and a driver chip for transmitting the signal to the third circuit.

Because the signal passes through the second circuit, electric characteristics of the signal are apt to deteriorate in this system. Though the receiver chip and the driver chip are effective in suppressing the deterioration of the electric characteristics, these cause rise of a cost.

SUMMARY OF THE INVENTION

It is therefore an object of this invention to provide a transmitting system capable of suppressing deterioration of electric characteristics of a signal passing through therein without a rise of cost.

It is another object of this invention to provide a connector for use in a transmitting system.

Other object of this invention will become clear as the description proceeds.

On describing the gist of this invention, it is possible to understand that a transmitting system has first, second and third circuit boards and first and second cables having one ends connected to the first and the third circuit boards, respectively. The first cable has a first connector at the other end for connecting the first cable to the second circuit board. The second cable has a second connector at the other end for connecting the second circuit board to the second cable.

According to the gist of this invention, a third connector is fixed on the second circuit board to commonly engage to both of the first and the second connectors.

According to another gist of this invention, a connector for use in a transmitting system comprises first engagement section which has first and second contacts to be engaged with first connector. The first contact is extended to outside to be connected to outer circuit. A second engagement section has third contact which is connected to the second contact to be engaged with second connector.

DESCRIPTION OF THE PREFERRED EMBODIMENT

Figure 1:
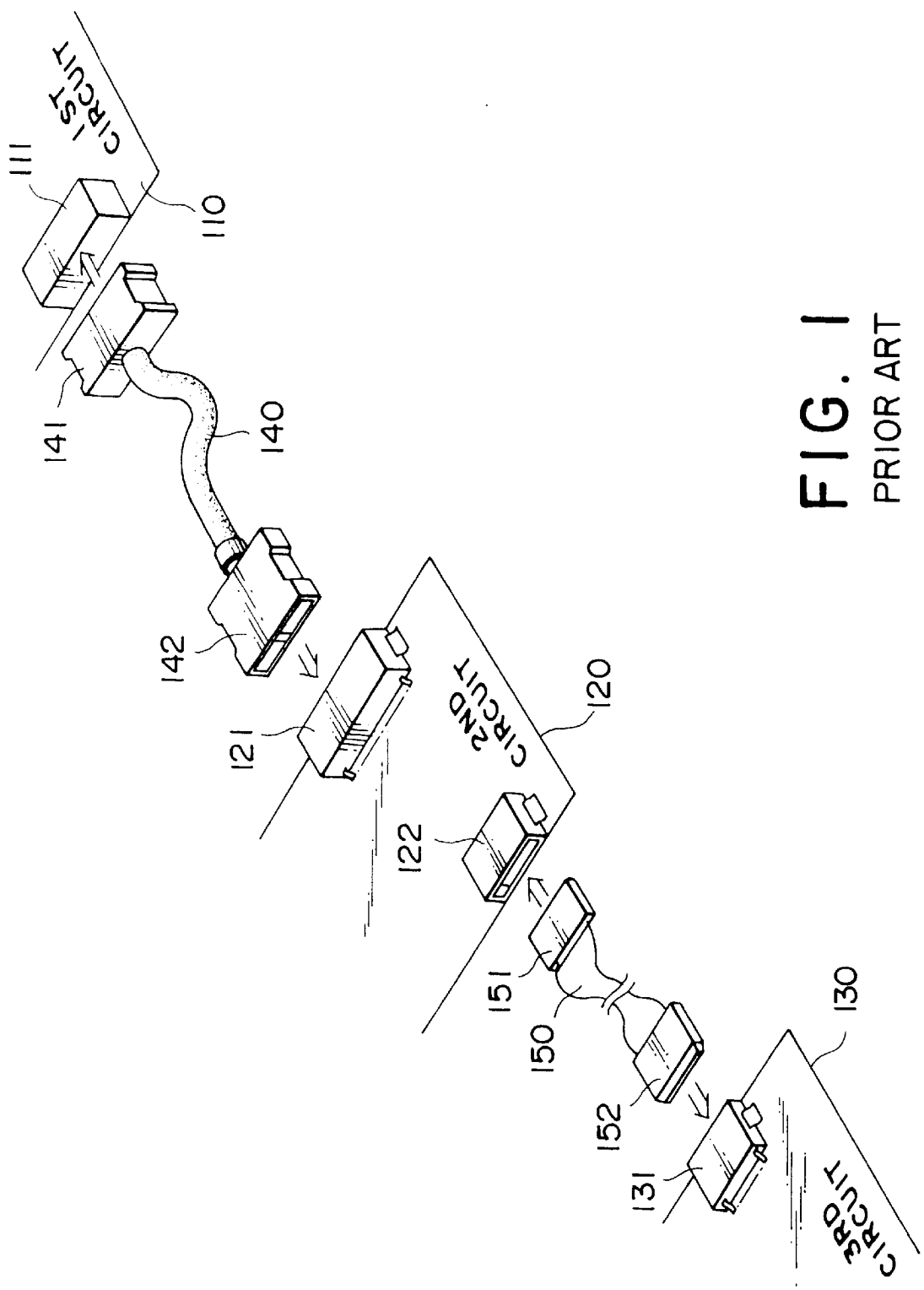
FIG. 1 shows a conventional transmitting system.

Referring to FIG. 1, description will be at first directed to a conventional transmitting system for a better understanding of this invention.

In FIG. 1, a conventional transmitting system has first, second and third circuit boards 110, 120 and 130 which have first, second and third circuits (not shown), respectively.

The first circuit board 110 equips a first connector 111 which is connected to the first circuit. The second circuit board 120 equips second and third connectors 121, 122 which are connected to the second circuit. The third circuit board 130 equips fourth connector 131 which is connected to the third circuit. The first, second, third and fourth connectors 111, 121, 122 and 131 are, for example, female connectors.

The first circuit board 110 and the third circuit board 130 are, for example, included in a personal computer and a LCD (liquid crystal display) unit, respectively. In this case, the first circuit board 110 and the third circuit board 130 transmit picture signals to each other. The second circuit board 120 is, for example, included in the personal computer or the LCD unit or detached from the personal computer and the LCD unit. The second circuit board 120 handles, for example, audio signals. In this case, the second circuit is called as a control board.

The first connector 111 and the second connector 121 are connected by a first cable 140. The first cable 140 has fifth and sixth connectors 141 and 142 at both ends. The connectors 141 and 142 can be engaged with the first and the second connectors 111 and 121, respectively. Namely, the connectors 141 and 142 are male connectors when the first and the second connectors 111 and 121 are female connectors.

The third connector 122 and the fourth connector 131 are connected by a second cable 150. The second cable 150 has seventh and eighth connectors 151 and 152 at both ends. The connector 151 and 152 can be engaged with the third and the fourth connectors 122 and 131, respectively. Namely, the connectors 151 and 152 are male connectors when the third and the fourth connectors 122 and 131 are female connectors.

In this system, the second and the third circuits receive transmission signals transmitted from the first circuit. The second circuit receives the transmission signals from the first circuit directly through the first cable. On the other hand, the third circuit receives the transmission signals from the first circuit through the second cable 150, the second circuit, and the first cable 140.

The second circuit may have a receiver chip to receive the transmission signals transmitted from the first circuit. Moreover, the second circuit may have a driver chip to transmit the transmitted signals to the third circuit.

The transmitting system has problems of impedance irregularity and skew at the second circuit. Namely, the transmitting system has fault that electric characteristics of the signal are apt to deteriorate because the transmitting signals passes through the second circuit.

Though the receiver chip and the driver chip are effective in suppressing the deterioration of the electric characteristics of the transmission signals, these cause rise of a cost.

Figure 2:
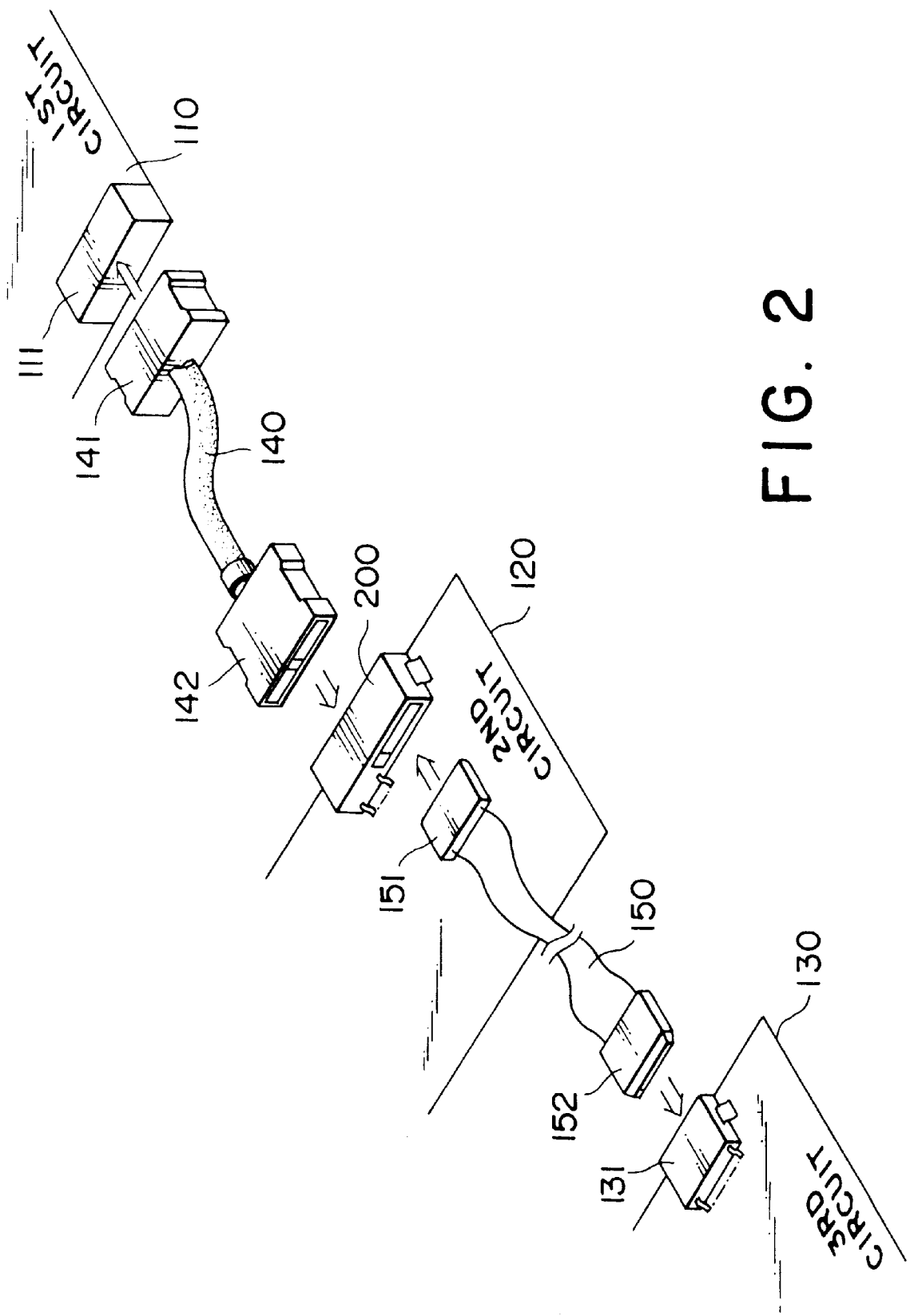
FIG. 2 shows a transmitting system according to a preferred embodiment of this invention.

Referring to FIGS. 2 and 3, the description will proceed to a transmitting system according to a preferred embodiment of this invention. Similar parts are designated by like reference numerals.

Figure 3A:
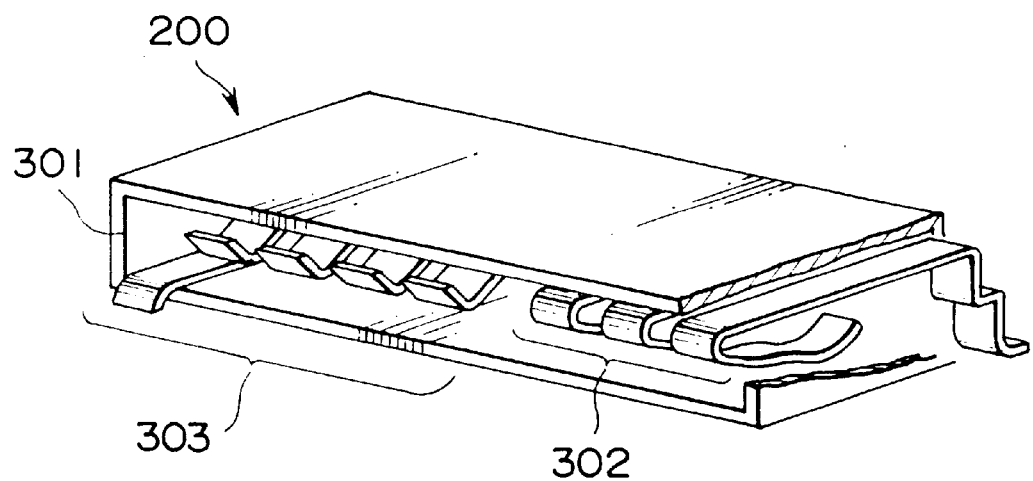
FIG. 3A shows a connector which is used in the transmitting system of FIG. 2.
Figure 3B:
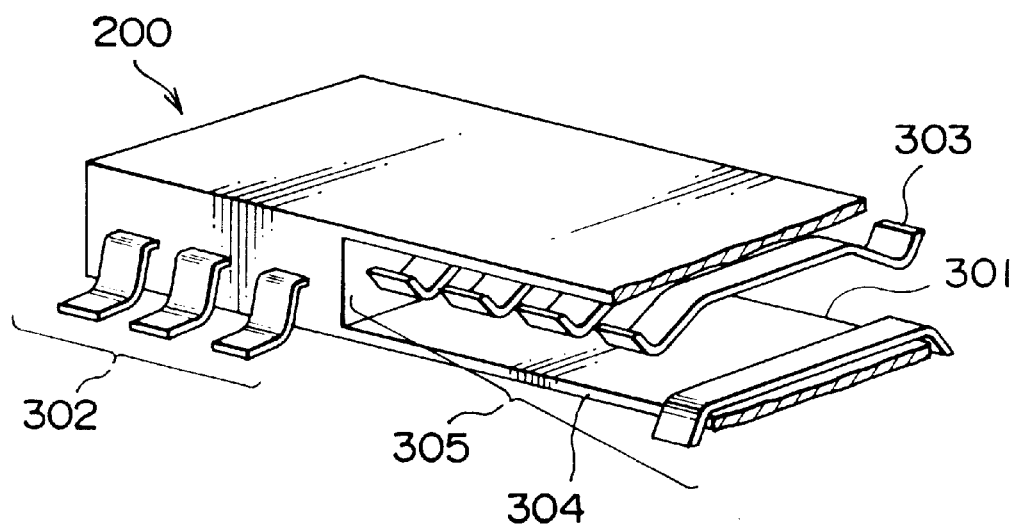
FIG. 3B shows the connector of FIG. 3A.

In FIG. 2, a transmitting system has a peculiar connector 200 which is fixed on the second circuit board 120 and has first through third contacts as described after with referring to FIGS. 3A and 3B. The first contacts are extended to outside and are connected to the second circuit. The second contacts and the third contacts are connected to each other. With use of the peculiar connector 200, an arrangement of the second circuit is changed in contrast with the conventional transmitting system.

The peculiar connector 200 is engaged with both of the sixth connector 142 and the seventh connector 151. The peculiar connector 200 electrically connects the sixth connector 142 to the seventh connector 151 through the second and the third contacts. Namely, all contacts of the seventh connector 151 are electrically connected to a part of contacts of the sixth connector 142 by the second and the third contacts of the peculiar connector 200. The remaining contacts of the sixth connector 142 are electrically connected to the second circuit through the first contacts of the peculiar connector 200.

When the first circuit transmits a first transmission signal to the third circuit, the first transmission signal passes through the first connector 111, the fifth connector 141, the first cable 140, the sixth connector 142, the peculiar connector 200, the seventh connector 151, the second cable 150, the eighth connector 152, and the fourth connector 131.

On the contrary, when the third circuit transmits a second transmission signal to the first circuit, the second transmission signal passes through the fourth connector 131, the eighth connector 152, the second cable 150, the seventh connector 151, the peculiar connector 200, the sixth connector 142, the first cable 140, the fifth connector 141, and the first connector 111.

Therefore, the first and the second transmission signals are transmitted between the first and third circuits without passing through the second circuit. Accordingly, factors which brings about deterioration of the electrically characteristics between the first and third circuits are less than the conventional transmitting system and the deterioration of the electrically characteristics can be suppressed without using the driver chip and the receiver chip. In other words, the problems of impedance irregularity and skew at the second circuit can be solved without using the driver chip and the receiver chip.

On the other hand, when the first circuit transmits a third transmission signal to the second circuit, the third transmission signal passes through the first connector 111, the fifth connector 141, the first cable 140, the sixth connector 142, and peculiar connector 200.

When the second circuit transmits a fourth transmission signal to the first circuit, the fourth transmission signal passes through the peculiar connector 200, the sixth connector 142, the first cable 140, the fifth connector 141, and the first connector 111.

The transmitting system is useful for standards of an LVDS (Low Voltage Differential Signaling), a GVIF (Gigabit Video Interface), a panel link, a USB (Universal Serial Bus), and a P1394 (IEEE).

In FIGS. 3A and 3B, the peculiar connector 200 has a first engagement section 301 at the front. The first engagement section 301 is engaged with the sixth connector 142. The first engagement section 301 has the first contacts 302 and the second contacts 303. Each of the first contacts 302 is extended to the outside in the back of the peculiar connector 200 as mentioned above. The peculiar connector 200 further has a second engagement section 304 at the back. The second engagement section 304 has third contacts 305 each of which is connected to one of the second contacts 303. Namely, a combination of each second contact and each third contact is a single contact. One of the third contact 305 (or/and the second contact 303) is for the ground and extended to the outside at the end.

Figure 4:
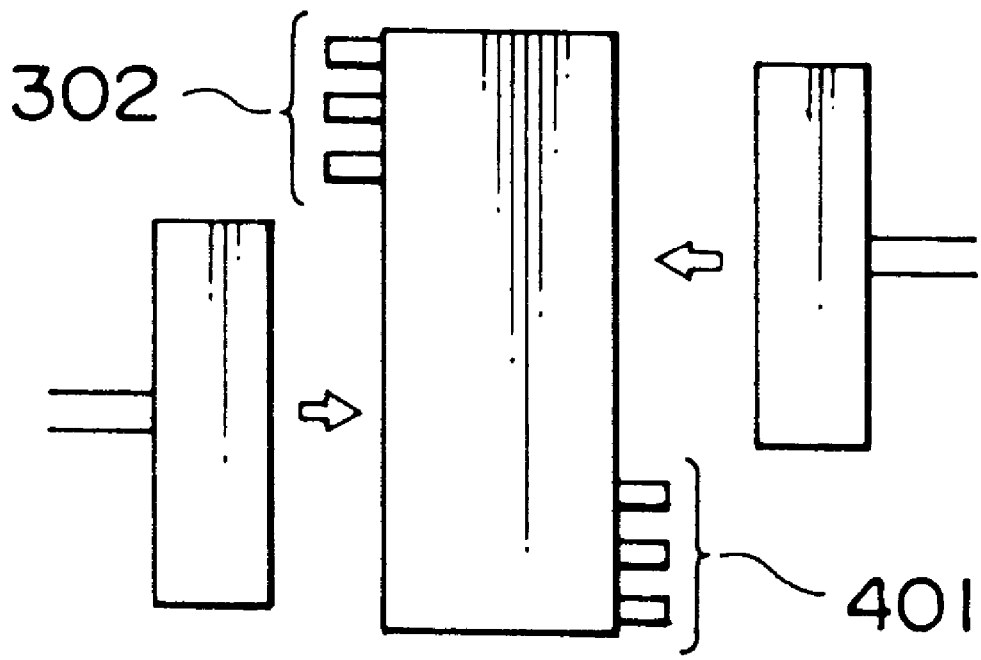
FIG. 4 shows another connector which is used in the transmitting system of FIG. 2.

While this invention has thus for been described in conjunction with preferred embodiment thereof, it will readily be possible for those skilled in the art to put this invention into practice in various other manners. For example, the peculiar connector 200 may have fourth contacts 401 like the first contacts 302 as shown in FIG. 4. The fourth contacts 401 are used for communication between the second circuit and the third circuit.

What is claimed is:

1. A transmitting system having first, second and third circuit boards and first and second cables each having one end connected to said first and said third circuit boards, respectively, said first cable having a first connector at the other end for transmitting first and second signals, said second cable having a second connector at the other end for transmitting the second signal, said second circuit board having a circuit, said transmitting system comprising:

a third connector fixed on said second circuit board for commonly engaging with both of said first and said second connectors to transmit the first signal between said first connector and said circuit and to transmit the second signal between said first connector and said second connector without passing through said circuit.

2. A transmitting system as claimed in claim 1, wherein said third connector has a first contact which connects said first cable to said circuit to transmit the first signal between said first cable and said circuit, and has a second contact which connects said first cable to said second cable to transmit the second signal between said first cable and said second cable without passing through said circuit.

3. A transmitting system as claimed in claim 1, a fourth connector fixed on said first circuit board, a fifth connector fixed on said third circuit board, wherein the end of said first cable has a sixth connector to be engaged to said fourth connector while the end of said second cable has a seventh connector to be engaged to said fifth connector.

4. A connector for use in a transmitting system, said connector comprising:

first engagement section having first and second contacts for being engaged with first connector, said first contact extended to outside to be connected to an outer circuit, and second engagement section having third contact which is connected to said second contact without connecting with said first contact for being engaged with second connector.

5. A connector as claimed in claim 4, wherein said second engagement section further has fourth contact which is extended to outside to be connected to said outer circuit.

* * * * *